United States Patent
Peng

(10) Patent No.: US 12,336,133 B2
(45) Date of Patent: Jun. 17, 2025

(54) DATA CENTER AND EXPANSION METHOD

(71) Applicant: Huawei Digital Power Technologies Co., Ltd., Shenzhen (CN)

(72) Inventor: Yonghui Peng, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 310 days.

(21) Appl. No.: 18/174,080

(22) Filed: Feb. 24, 2023

(65) Prior Publication Data

US 2023/0199998 A1     Jun. 22, 2023

Related U.S. Application Data

(63) Continuation of application No. PCT/CN2020/111928, filed on Aug. 27, 2020.

(51) Int. Cl.
   *H05K 7/14*        (2006.01)
   *H05K 7/20*        (2006.01)

(52) U.S. Cl.
    CPC ......... *H05K 7/1492* (2013.01); *H05K 7/2079* (2013.01)

(58) Field of Classification Search
    CPC .............. H05K 7/1492; H05K 7/2079; H05K 7/20781; H05K 7/1498
    See application file for complete search history.

(56) References Cited

U.S. PATENT DOCUMENTS

| | | | |
|---|---|---|---|
| 9,572,290 B2 | 2/2017 | Chen | |
| 2015/0319878 A1 | 11/2015 | Morales et al. | |
| 2016/0021793 A1 | 1/2016 | Chen | |
| 2016/0196766 A1 | 7/2016 | Lundin | |
| 2017/0105310 A1 | 4/2017 | Chen | |
| 2018/0192538 A1* | 7/2018 | Sakalkar | H05K 7/1492 |
| 2019/0361474 A1 | 11/2019 | Chapel et al. | |
| 2022/0346265 A1* | 10/2022 | Heydari | H01M 8/04156 |

FOREIGN PATENT DOCUMENTS

| | | |
|---|---|---|
| CN | 105376986 A | 3/2016 |
| CN | 108930423 A | 12/2018 |
| WO | 2016011186 A1 | 1/2016 |

* cited by examiner

*Primary Examiner* — Emmanuel E Duke
(74) *Attorney, Agent, or Firm* — Maier & Maier, PLLC

(57) ABSTRACT

A data center and an expansion method are provided to avoid a phenomenon of dense cables during data center expansion. In the data center, a first power device is connected to a computing device by using a bus, and a plug-in node and an idle electrical connection end are pre-disposed on the bus. In this way, when expansion is required, a second power device for expansion is directly added to the idle electrical connection end, and the bus is disconnected by using the plug-in node. In this way, the first power device and the second power device for expansion respectively supply power to the computing device by using two parts of the disconnected bus. According to this mode, no additional cable is required during the data center expansion, but an existing cable is directly disconnected to support power supply of a power device for expansion.

14 Claims, 12 Drawing Sheets

DATA CENTER AND EXPANSION METHOD

CROSS-REFERENCE TO RELATED APPLICATIONS

This application is a continuation of International Application No. PCT/CN2020/111928, filed on Aug. 27, 2020, the disclosure of which is hereby incorporated by reference in its entirety.

TECHNICAL FIELD

The embodiments relates to the field of power electronics technologies, a data center, and an expansion method.

BACKGROUND

A data center (DC) is an information infrastructure that uses internet communication lines and bandwidth resources to transfer information, accelerate data, display content, compute data, and store resources between regions over the world. A power device and various types of computing devices, such as a server, a monitoring device, a management device, and a security device, may be deployed in a data center. The power device can supply power to these computing devices, and the computing devices may be deployed in different cabinets of the data center according to respective types of the computing devices. An information communication process of the data center is implemented through a fixed connection manner between the power device and the computing device.

According to conventional civil construction, a construction period of the data center may be approximately 1 to 2 years and service life of the data center may be more than 10 years. However, power and a footprint of the device of the data center may have already been determined. This means that without device upgrades, device power in the data center may remain the same as the device power within 10 years of a life cycle. With rapid development of data centers, device power required by the data center also increases gradually. For example, at present, device power density of mainstream data centers is approximately 8-15 kW/cabinet. However, in the following 1 to 2 years, device power density of data centers is expected to reach 30 kW/cabinet or higher.

However, it is currently in a stage of global data explosion. In the entire life cycle of the data center, it may be difficult for the device power to meet gradually increasing requirements on power. In this case, the computing device in the data center needs to be upgraded. For example, the device power needs to be increased in a software manner or a hardware manner. As the device power is increased, the existing power device in the data center may no longer support the increased device power. As a result, a new power device needs to be added in the data center (which is referred to as data center expansion). However, according to an expansion manner in a conventional technology, the existing power device in the data center is connected to each computing device in a fixed cabling mode. Therefore, when a new power device is added, a cable needs to be added between the new power device and each computing device. According to this mode, cables in the data center are very dense, so that construction costs of the data center are increased imperceptibly.

SUMMARY

The embodiments may provide a data center, to avoid a phenomenon of dense cables during data center expansion.

According to a first aspect, the embodiments may provide a data center. The data center includes N computing devices and K power modules. Each power module in the K power modules may include a first power device and a bus. The bus includes a first electrical connection end, N intermediate ends, and a second electrical connection end. The first electrical connection end is configured to connect the first power device. The N intermediate ends are respectively configured to connect the N computing devices. A plug-in node is disposed between an $(I-1)^{th}$ intermediate end and an $I^{th}$ intermediate end of the N intermediate ends. The plug-in node divides the bus into a first subline and a second subline. K is a positive integer, N and I are positive integers greater than or equal to 2, and it is satisfied that I<N. By using such a deployment architecture of the data center, for at least one power module in the K power modules: Before the data center is expanded, the plug-in node of the power module communicates the first subline with the second subline, and the second electrical connection end of the at least one power module is idle. In this way, the first power device in the power module may supply power to the N computing devices by using the first subline and the second subline that communicate with each other. After the data center is expanded, the plug-in node of the at least one power module disconnects the first subline and the second subline, and the second electrical connection end of the at least one power module is connected to a second power device for expansion. In this way, the first power device in the power module may supply power to L computing devices in the N computing devices by using the first subline, and the second power device for expansion may supply power to remaining N−L computing devices by using the second subline.

The plug-in node and the idle electrical connection end may be disposed on the bus, so that a power device for expansion can be directly added to the idle electrical connection end when expansion is required, and the bus can be disconnected by using the plug-in node. In this way, the power device for expansion may use a part of the disconnected bus to supply power to the computing device, while the original power device may use the other part of the disconnected bus to supply power to the computing device. According to this mode, that the original power device supplies power to N computing devices can be expanded to that the original power device and the power device for expansion together supply power to the N computing devices. Moreover, no additional cable may be required during the data center expansion, but an existing cable may be directly disconnected to support power supply of the power device for expansion. Therefore, cables of the data center may be final cables of the data center. Provided that the cables in the initial design are not dense, cables of the data center may not become excessively dense even when the data center is expanded, thereby helping resolve a problem of dense cables during the data center expansion. In addition, according to this mode, data center reconstruction is not required during the expansion, thereby helping reduce construction costs of the data center.

The N computing devices may be placed in one or more computing-device block boxes, first power devices in the T power modules may be placed in one or more power-device block boxes, and the one or more computing-device block boxes and the one or more power-device block boxes are disposed at a same layer in the data center. In this way, the N computing devices can directly use the power devices that are deployed at a same layer as the N computing devices to supply power. Because a path between the computing device and the power device that are deployed at a same layer is relatively short, this mode helps reduce cabling costs and simplify cabling complexity.

When a quantity of the one or more computing-device block boxes is greater than or equal to 2, the one or more computing-device block boxes may be disposed in parallel to form a computing-device block box module. In this case, the one or more power-device block boxes may be placed on one side or both sides of the computing-device block box module. In this way, cables from the power device to the computing device may be led out from one fixed side-surface position or two fixed side-surface positions. This mode helps improve balance of cabling deployment, facilitates cabling management, and avoids a case of cabling disorder. In addition, a side-surface cable leading manner further helps reduce a path distance between the power device and the computing device, thereby effectively reducing cabling costs.

The data center may further include a general water inlet pipe, a general water outlet pipe, and L refrigeration devices, and the L refrigeration devices are configured to cool the N computing devices. P water inlets may be disposed on the general water inlet pipe, and L water inlets in the P water inlets are respectively connected to water inlet ends of the L refrigeration devices. P water outlets may be disposed on the general water outlet pipe, and L water outlets in the P water outlets are respectively connected to water outlet ends of the L refrigeration devices. P and L are positive integers, and it is satisfied that P>L. In this case, before the data center is expanded, P-L water inlets except the L water inlets in the P water inlets may be idle, and P-L water outlets except the L water outlets in the P water outlets may be idle. In this way, the data center may implement cooling functions of the L refrigeration devices through water inlet operations of the L water inlets and water outlet operations of the L water outlets. After the data center is expanded, one or more water inlets in the idle P-L water inlets may be respectively connected to water inlet ends of one or more refrigeration devices for expansion, and one or more water outlets in the idle P-L water outlets may be respectively connected to water outlet ends of the one or more refrigeration devices for expansion. In this way, the data center can implement cooling functions of the L original refrigeration devices and at least one refrigeration device for expansion through water inlet operations of at least L+1 water inlets and water outlet operations of at least L+1 water outlets.

The data center may further support adding of any quantity of refrigeration devices for expansion while the power device for expansion is added. According to this mode, a cooling effect can be improved when device power is increased, and there is no need to add excessive refrigeration devices, thereby helping reduce a capital expenditure of the data center.

The L refrigeration devices may be placed in one or more refrigeration-device block boxes. When a quantity of the one or more refrigeration-device block boxes is greater than or equal to 2, the one or more refrigeration-device block boxes may be placed in parallel, and side surfaces of any two adjacent refrigeration-device block boxes communicate with each other. In this way, there is no extra space between the refrigeration-device block boxes, thereby helping reduce a space waste in the data center and improving space utilization of the data center.

The one or more refrigeration-device block boxes and the one or more computing-device block boxes may be disposed at a same layer in the data center, and the one or more refrigeration-device block boxes may be placed on one side of an end wall of the one or more computing-device block boxes. The end wall is disposed on a side surface perpendicular to a side surface that is disposed in parallel with the one or more computing-device block boxes. An air supply channel and an air return channel may be disposed on the end wall, and the L refrigeration devices in the one or more refrigeration-device block boxes cool the N computing devices by using the air supply channel and the air return channel. The refrigeration device in the refrigeration-device block box may be separated from the computing device at a distance of only one end wall, so that cold air released by a refrigeration block can be directly output to the computing-device block box through a relatively short distance, thereby helping achieve a relatively good cooling effect.

When T is a positive integer greater than or equal to 2, for each power module in the T power modules: the bus of the power module may be led out from the power-device block box in which the first power device of the power module is located, traverses the one or more refrigeration-device block boxes, leads out N sublines from the end wall to respectively connect the N computing devices, and terminates in the power-device block box in which the first power device of another power module is located. The first electrical connection end of the power module is located in the power-device block box in which the first power device of the power module is located, and the idle second electrical connection end of the power module is located in the power-device block box in which the first power device of the another power module is located. Space in the power-device block box and the refrigeration-device block box may be fully utilized by the cables of the data center, so that the space utilization of the data center can be effectively improved. Further, when there are two power devices, respectively placing the two power devices in two power block boxes further helps balance device resources deployed in various space in the data center.

The one or more refrigeration-device block boxes may be placed in parallel to form a refrigeration-device block box module. In this case, the data center may further include one or more tube wells, and the one or more tube wells may be disposed on one side or both sides of the refrigeration-device block box module. The tube well may have functions of assisting power expansion and cooling expansion and may be configured to accommodate a power cable and a pipeline cable on left and right sides of the refrigeration-device block box.

According to a second aspect, the embodiments may provide a data center expansion method. The method may be applied to the data center in the first aspect, and the method may include: first, detecting device power of N computing devices in the data center; and if the device power is greater than a preset expansion device power threshold, determining at least one power module from T power modules, and for each power module in the at least one power module: controlling a first power device in the power module to be in a power-off state, and disconnecting a plug-in node of the power module. In this way, after it is detected that a second power device for expansion is connected to an idle second electrical connection end of the power module, the first power device and the second power device for expansion are controlled to be in a power supply state.

After a power upgrade is performed on the computing device, the data center can be expanded by directly using original cables, without adding new cables. In this way, a case of dense cables during the data center expansion can be avoided, thereby saving space occupied by the cables, and improving space utilization of the data center. Moreover, cables of the data center during initial construction are final cables. Therefore, even if the data center is expanded at a later stage, the data center may not be reconstructed, and no additional cable is required. In this case, this mode further helps reduce construction costs of the data center.

When the data center further includes a general water inlet pipe, a general water outlet pipe, and L refrigeration devices, temperatures of the N computing devices may be detected after the controlling the first power device and the second power device for expansion to be in a power supply state. If the detected temperature is greater than a preset temperature threshold, a water inlet operation of the general water inlet pipe and a water outlet operation of the general water outlet pipe may be suspended. Subsequently, after it is detected that a refrigeration device for expansion is connected to the general water inlet pipe and the general water outlet pipe, the water inlet operation of the general water inlet pipe and the water outlet operation of the general water outlet pipe are restored. The data center may further perform cooling expansion along with power expansion, thereby helping match a cooling effect for the computing device with power of the computing device.

These aspects are described in detail in the following embodiments.

DETAILED DESCRIPTION OF THE EMBODIMENTS

In recent years, rapid development of data centers has led to an increasing demand for device power in the data centers. In this scenario, if a computing device in the data center is upgraded to increase the device power, electric energy provided by an original power device may no longer support the increased device power. As a result, the data center needs to be expanded. However, for a conventional data center, space in which a power device is located may have been fixed and the space may not accommodate a new power device. Therefore, according to a conventional expansion mode, to implement expansion, a conventional data center needs to be re-planned and reconstructed. For example, the space in which the power device is located is first expanded, and then a new power device is placed in the expanded space, and finally, cabling from the power device to a computing device is reconstructed (a quantity of cables or a width of a wire cable wrapping the cable is increased). In this way, the reconstructed cabling can include both cabling from the original power device to the computing device and cabling from the new power device to the computing device. According to this conventional expansion mode, the space of the data center needs to be re-planned and reconstructed, which not only wastes time and efforts, but also makes the data center unavailable for a long time. As a result, a normal service capability of the data center is seriously affected.

Figure 1:
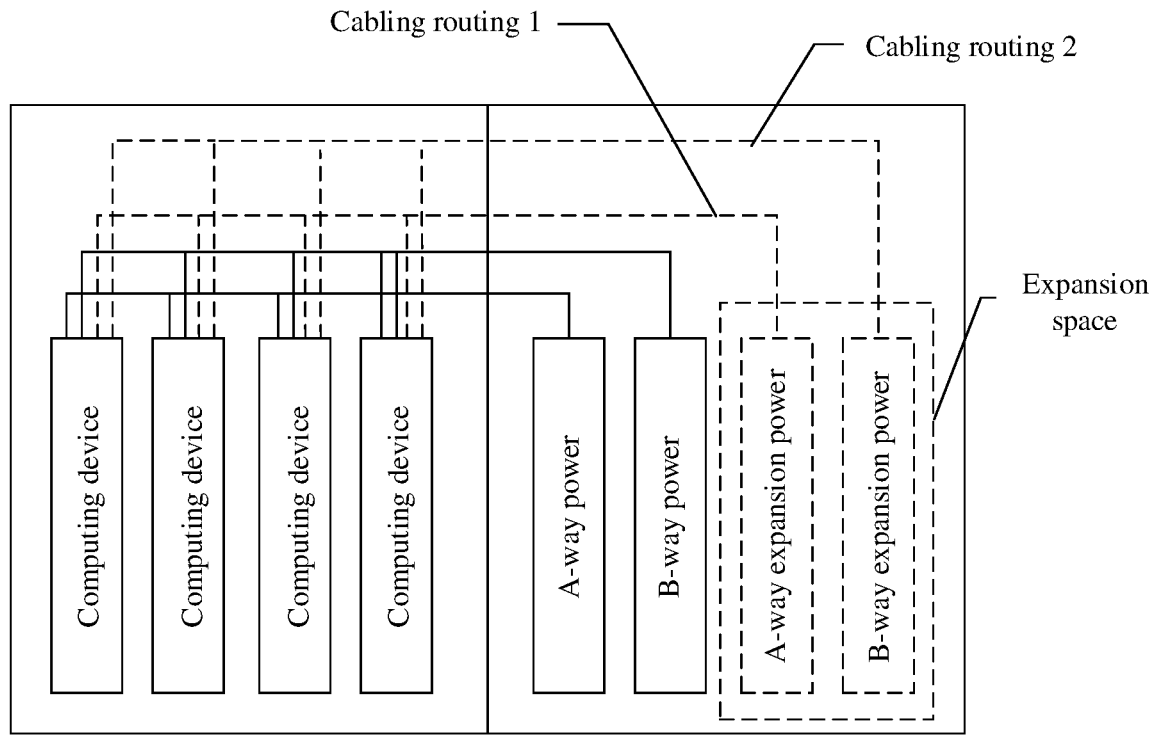
FIG. 1 shows an example of a schematic diagram of an optional deployment structure of a data center.

To resolve the foregoing problem, FIG. 1 shows an example of a schematic diagram of an optional deployment structure of a data center. As shown in FIG. 1, according to this implementation, expansion space and cabling routing of a power device may be first reserved. For example, the reserved expansion space of the power device includes A-way expansion power and B-way expansion power in FIG. 1, and the reserved cabling routing includes cabling routing 1 and cabling routing 2 in FIG. 1. In this deployment mode, after each computing device is upgraded, if original A-way power and B-way power cannot provide corresponding device power because device power of each computing device increases, the A-way expansion power may be directly added to the A-way power in the reserved expansion space, and cables from the A-way expansion power to each computing device may be deployed in the reserved cabling routing 1; and the B-way expansion power may be added to the B-way power, and cables from the B-way expansion power to each computing device may be deployed in the reserved cabling routing 2. As shown in FIG. 1, although this mode can avoid re-planning and reconstruction of space of the data center during expansion through the reserved expansion space and cabling routing, this mode still requires deploying of new cables between a new power device and each computing device. As a result, cables between space in which the power device is located and space in which the computing device is located are very dense (if a plurality of cables are wrapped by a same wire cable, the wire cable is relatively wider). Such dense cables not only occupy relatively large space of the data center and reduce space utilization of the data center, but also increase construction costs of the data center. In addition, according to this mode, cables need to be added between the newly added power device and each computing device. To ensure electricity safety, each computing device needs to be brought offline during data center expansion. Therefore, according to this mode, the data center is made unavailable for a long time, and thus a service capability of the data center becomes worse.

In view of the foregoing description, the embodiments may provide a data center, to avoid a phenomenon of dense cables during data center expansion, and further implement online expansion of the data center.

The following describes the embodiments with reference to the accompanying drawings. It should be understood that "a plurality of" is understood as "at least two". Terms "first" and "second" are merely intended for a purpose of distinguishing between descriptions, and shall not be understood as an indication or implication of relative importance or indication or implication of a sequence. For example, "first electrical connection end" and "second electrical connection end" described below are used to indicate connection ends at different positions, and are not different in a sequence or importance.

It should be noted that, in the following embodiments, online means power supply, and offline means power off. When a power device gets online, the power device may provide electric energy to other devices. When the power device gets offline, the power device cannot provide electric energy to other devices. There are a plurality of manners for the power device to get online and get offline. For example, in one example, when the power device is connected to a computing device, a switch may be disposed between the power device and the computing device. When the switch is turned on, the power device may get online. When the switch is turned off, the power device may get offline. For another example, in another example, a switch is disposed between an internal power supply and an output port of the power device. When the switch is turned on, the power device may get online. When the switch is turned off, the power device may get offline.

Embodiment 1

Figure 2:
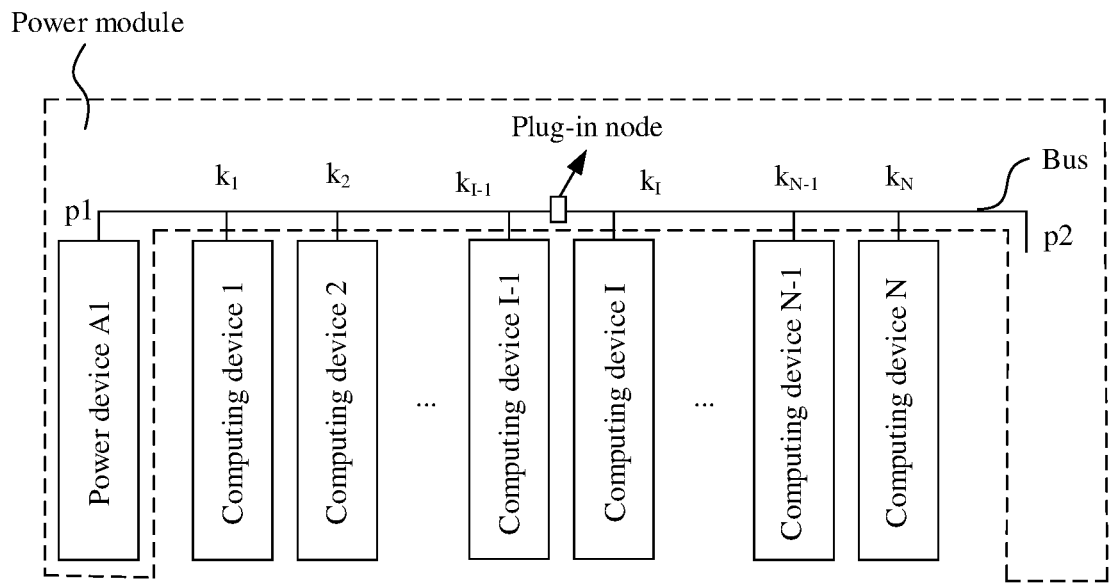
FIG. 2 shows an example of a schematic diagram of a deployment architecture of a data center according to Embodiment 1.

FIG. 2 shows an example of a schematic diagram of a deployment architecture of a data center according to Embodiment 1. As shown in FIG. 2, the data center may include one power module and N computing devices, that is, a computing device 1, a computing device 2, . . . , a computing device I-1, a computing device I, . . . , a computing device N-1, and a computing device N. The power module may include a bus and a first power device (A1). Two ends of the bus are respectively a first electrical connection end $p_1$ and a second electrical connection end $p_2$. The first electrical connection end $p_1$ corresponds to the power device A1. The second electrical connection end $p_2$ may be in different states before the data center is expanded and after the data center is expanded. The bus may also be provided with N intermediate ends, that is, an intermediate end $k_1$, an intermediate end $k_2$, . . . , an intermediate end $k_{I-1}$, an intermediate end $k_I$, . . . , an intermediate end $K_{N-1}$, and an intermediate end $k_N$. The bus respectively leads out N sublines from the N intermediate ends to connect the computing devices 1 to N. As shown in FIG. 2, a plug-in node is further disposed between the intermediate end $k_{I-1}$ and the intermediate end $k_I$ of the bus. The plug-in node divides the bus into a first subline and a second subline (this is not illustrated in FIG. 2). The first subline includes a bus segment from the first electrical connection end $p_1$ to the plug-in node, and the second subline includes a bus segment from the plug-in node to the second electrical connection end $p_2$.

Figure 3A:
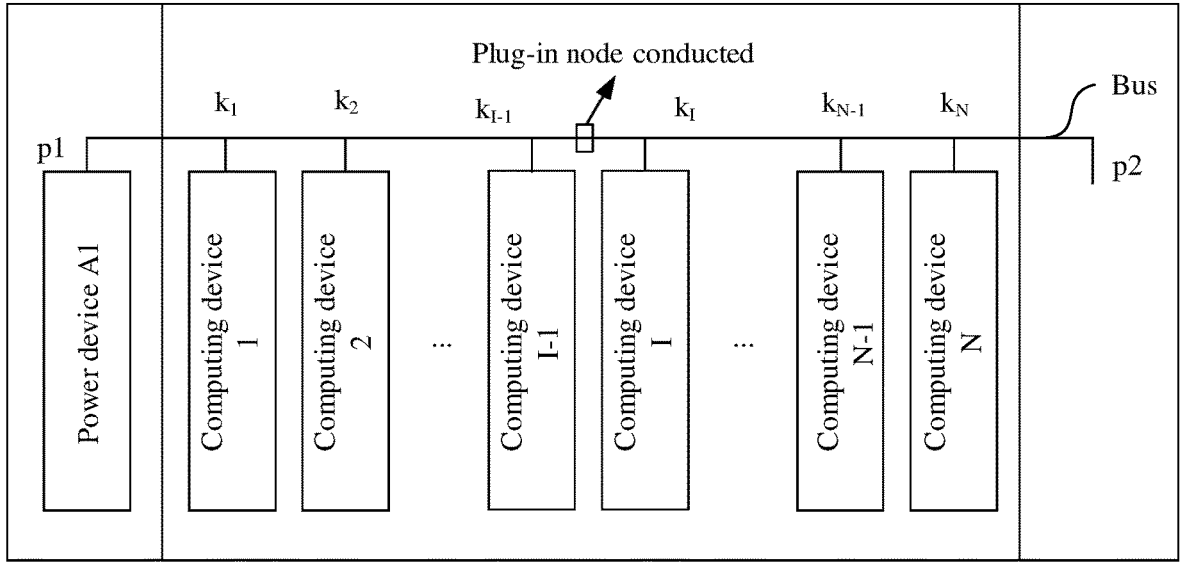
FIG. 3A shows an example of a schematic diagram of a connection state of a data center before being expanded according to Embodiment 1.
Figure 3B:
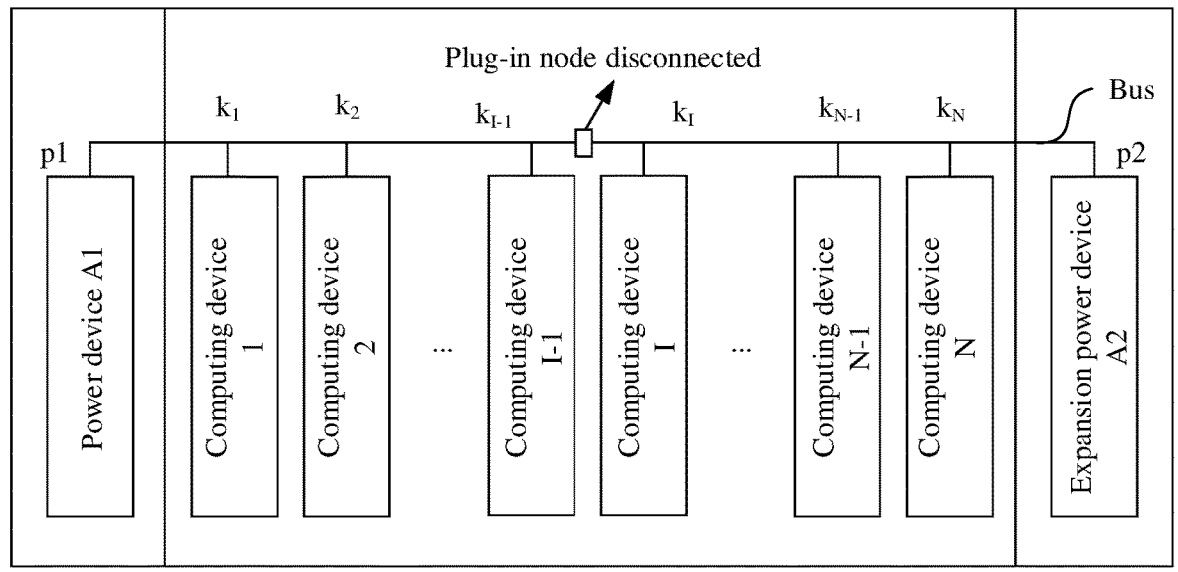
FIG. 3B shows an example of a schematic diagram of a connection state of a data center after being expanded according to Embodiment 1.

FIG. 3A shows an example of a schematic diagram of a connection state of a data center before being expanded according to Embodiment 1. FIG. 3B shows an example of a schematic diagram of a connection state of a data center after being expanded according to Embodiment 1. The following describes an expansion process of the data center in Embodiment 1 with reference to FIG. 3A and FIG. 3B.

In Embodiment 1, during initial construction, the data center may be according to the architecture shown in FIG. 2. Electric energy of the power device A1 can support initial device power required by the N computing devices. In this way, when completed but not put into use, referring to FIG. 3A, because the electric energy of the power device A1 is sufficient for use, the second electrical connection end $p_2$ may be set to an idle state (for example, the second electrical connection end $p_2$ is fastened on an insulation plug or is wrapped by using an insulation cable, to avoid an electric-shock accident). In addition, to ensure electricity safety, the power device A1 may temporarily not be brought online, but the first subline and the second subline are first socketed together at the plug-in node to conduct the first subline and the second subline, and then the power device A1 is brought online. In this case, the power device A1 may respectively supply power to the computing devices 1 to N by using the first subline and the second subline that are conducted.

Further, during use of the data center, it is determined that the data center needs to be expanded if it is detected that device power of the N computing devices increases because an upgrade operation is performed on the N computing devices, and the electric energy provided by the power device A1 cannot support the increased device power. Referring to FIG. 3B, during expansion, to ensure electricity safety, the power device A1 may be first brought offline, and then the first subline and the second subline are disconnected at the plug-in node. Subsequently, a second power device (A2. To distinguish an original power device from a power device for expansion, the power device for expansion is referred to as an expansion power device hereinafter) for expansion is added in the data center, and the second electrical connection end $p_2$ is connected to the expansion power device A2. Finally, the power device A1 and the expansion power device A2 are brought online. In this case, the power device A1 may supply power to the computing devices I to I-1 by using the first subline, and the expansion power device A2 may supply power to the computing devices I to N by using the second subline.

It should be noted that "Finally, the power device A1 and the expansion power device A2 are brought online" is only an optional implementation. In this embodiment, after the first subline and the second subline are disconnected at the plug-in node, because the first subline and the second subline are no longer conducted, the electric energy of the power device A1 cannot be transmitted to the computing devices I to N. Therefore, in another optional implementation, to avoid that all the N computing devices are unavailable for a long time, the power device A1 may be brought online immediately after the first subline and the second subline are disconnected by using the plug-in node, to restore the power supply for the computing devices I to I−1 in a timely manner. Subsequently, the expansion power device A2 is added in the data center, and the second electrical connection end $p_2$ is connected to the expansion power device A2. Finally, the expansion power device A2 is brought online. In this case, although a connection between the expansion power device A2 and the second subline is added after the power device A1 is brought online, because the second subline has been disconnected from the power device A1, an operation on the second subline is not affected by the power device A1. In other words, an operation performed after the power device A1 is brought online complies with an electricity specification.

An expansion solution in Embodiment 1 is described below by using a scenario. In this scenario, it is assumed that a value of N is 6, the plug-in node is disposed between an intermediate end $k_3$ and an intermediate end $k_4$, and both the power device A1 and the expansion power device A2 can provide 6 kW of electric power.

In this case, before the data center is expanded, the power device A1 provides 6 kW of electric power in total for six computing devices. If the six computing devices share the electric power evenly, each computing device can obtain 1 kW of electric power.

After the data center is expanded, the power device A1 provides 6 kW of electric power for computing devices 1 to 3, and the expansion power device A2 provides 6 kW of electric power for computing devices 4 to 6. If the six computing devices share the electric power evenly, each computing device can obtain 2 kW of electric power.

It can be understood from the foregoing description that, when the electric power provided by the expansion power device is the same as that provided by the power device, the expansion solution in Embodiment 1 supports expansion of a computing device whose power is doubled.

In the foregoing Embodiment 1, the data center may be expanded directly by using original cables, without adding new cables. In this way, a case of dense cables during the data center expansion can be avoided, thereby saving space occupied by the cables, and improving space utilization of the data center. Moreover, cables of the data center during initial construction are final cables. Therefore, even if the data center is expanded at a later stage, the data center may not be reconstructed, and no additional cable is required. In this case, this mode further helps reduce construction costs of the data center.

Embodiment 2

Figure 4:
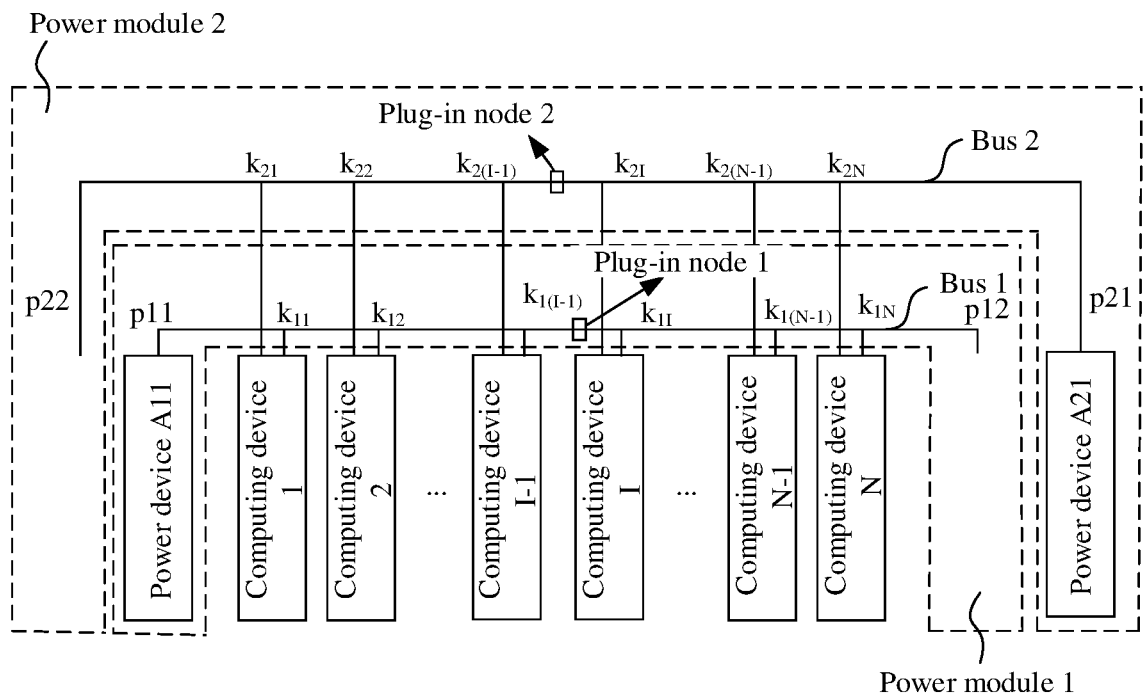
FIG. 4 shows an example of a schematic diagram of a deployment architecture of a data center according to Embodiment 2.

FIG. 4 shows an example of a schematic diagram of a deployment architecture of a data center according to Embodiment 2. As shown in FIG. 4, the data center may include two power modules (that is, a power module 1 and a power module 2) and N computing devices, that is, a computing device I, a computing device 2, . . . , a computing device I−1, a computing device I, . . . , a computing device N−1, and a computing device N. The power module 1 includes a bus 1 and a power device A11. Two ends of the bus 1 are respectively an electrical connection end $p_{11}$ and an electrical connection end $p_{12}$. The electrical connection end $p_{11}$ corresponds to the power device A11. The electrical connection end $p_{12}$ may be in different states before the data center is expanded and after the data center is expanded. The bus 1 is further provided with N intermediate ends, that is, an intermediate end $k_{11}$, an intermediate end $k_{12}$, . . . , an intermediate end $k_{1(I-1)}$, an intermediate end $k_{1I}$, . . . , an intermediate end $k_{1(N-1)}$, and an intermediate end $k_{1N}$. The bus 1 respectively leads out N sublines from the N intermediate ends to connect the computing devices 1 to N. Correspondingly, the power module 2 includes a bus 2 and a power device A21. Two ends of the bus 2 are respectively an electrical connection end $p_{21}$ and an electrical connection end $p_{22}$. The electrical connection end $p_{21}$ corresponds to the power device A21. The electrical connection end $p_{22}$ may be in different states before the data center is expanded and after the data center is expanded. The bus 2 may also be provided with N intermediate ends, that is, an intermediate end $k_{21}$, an intermediate end $k_{22}$, . . . , an intermediate end $k_{2(I-1)}$, an intermediate end $k_{2I}$, . . . , an intermediate end $k_{2(N-1)}$, and an intermediate end $k_{2N}$. The bus 2 respectively leads out N sublines from the N intermediate ends to connect the computing devices 1 to N.

Still referring to FIG. 4, a plug-in node 1 may be further disposed between the intermediate end $k_{1(I-1)}$ and the intermediate end $k_{1I}$ of the bus 1. The plug-in node 1 divides the bus 1 into a subline 1 and a subline 2 (this is not illustrated in FIG. 4). The subline 1 includes a bus segment from the electrical connection end $p_{11}$ to the plug-in node 1, and the subline 2 includes a bus segment from the plug-in node 1 to the electrical connection end $p_{12}$. Correspondingly, a plug-in node 2 may be further disposed between the intermediate end $k_{2(I-1)}$ and the intermediate end $k_{21}$ of the bus 2. The plug-in node 2 divides the bus 2 into a subline 3 and a subline 4 (this is not illustrated in FIG. 4). The subline 3 includes a bus segment from the electrical connection end $p_{21}$ to the plug-in node 2, and the subline 4 includes a bus segment from the plug-in node 2 to the electrical connection end $p_{22}$.

It should be noted that, that "the plug-in node 1 is disposed between the intermediate end $k_{1(I-1)}$ and the intermediate end $k_{1I}$, and the plug-in node 2 is disposed between the intermediate end $k_{2(I-1)}$ and the intermediate end $k_{21}$" is only an optional implementation. In this implementation, both the plug-in node 1 and the plug-in node 2 separate the computing devices I to I−1 from the computing devices I to N. In other optional implementations, the computing devices separated by the plug-in node 1 and the plug-in node 2 may be different. For example, in one case, the plug-in node 1 may be disposed between the intermediate end $k_{1(I-1)}$ and the intermediate end $k_{1I}$, and the plug-in node 2 may be disposed between the intermediate end $k_{21}$ and an intermediate end $k_2$ (I+1). In this way, the plug-in node 1 separates the computing devices 1 to I−1 from the computing devices I to N, and the plug-in node 2 separates the computing devices 1 to I from the computing devices I+1 to N. Alternatively, in another case, the plug-in node 1 may be disposed between an intermediate end $k_{1(I+1)}$ and an intermediate end $k_{1(I+2)}$, and the plug-in node 2 may be disposed between the intermediate end $k_{2(I-1)}$ and the intermediate end $k_{2I}$. In this way, the plug-in node 1 separates the computing devices 1 to I+1 from the computing devices I+2 to N, and the plug-in node 2 separates the computing devices 1 to I−1 from the computing devices I to N. There are many optional implementations, and details are not described herein.

Figure 5A:
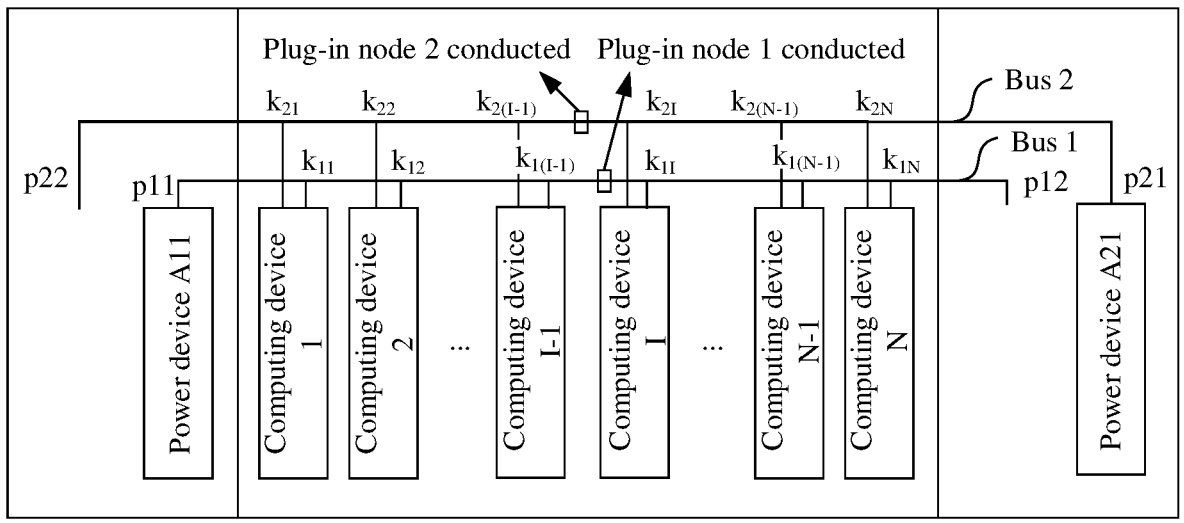
FIG. 5A shows an example of a schematic diagram of a connection state of a data center before being expanded according to Embodiment 2.

FIG. 5A shows an example of a schematic diagram of a connection state of a data center before being expanded according to Embodiment 2. FIG. 5B to FIG. 5E show an example of a schematic diagram of a connection state of a data center after being expanded according to Embodiment 2. The following describes an expansion process of the data center in Embodiment 2 with reference to FIG. 5A to FIG. 5E.

In Embodiment 2, during initial construction, the data center may be according to the architecture shown in FIG. 4. Electric energy of the power device A11 and the power device A21 can support initial device power required by the N computing devices. In this way, before being completed and put into use, referring to FIG. 5A, because the electric energy of the power device A11 and the power device A21 is sufficient for use, the electrical connection end $p_{12}$ and the electrical connection end $p_{22}$ may be set to an idle state. In addition, to ensure electricity safety, the power device A11 and the power device A21 may temporarily not be brought online, but the subline 1 and the subline 2 are first socketed together at the plug-in node 1 to conduct the subline 1 and the subline 2, and then the power device A11 is brought online. Subsequently, the subline 3 and the subline 4 are socketed together at the plug-in node 2 to conduct the subline 3 and the subline 4, and then the power device A21 is brought online. In this case, the power device A11 supplies power to the computing devices 1 to N by using the subline 1 and the subline 2 that are conducted, and the power device A21 supplies power to the computing devices 1 to N by using the subline 3 and the subline 4 that are conducted. Total electric power of the N computing devices is comprehensively provided by the power device A11 and the power device A21.

Figure 5B:
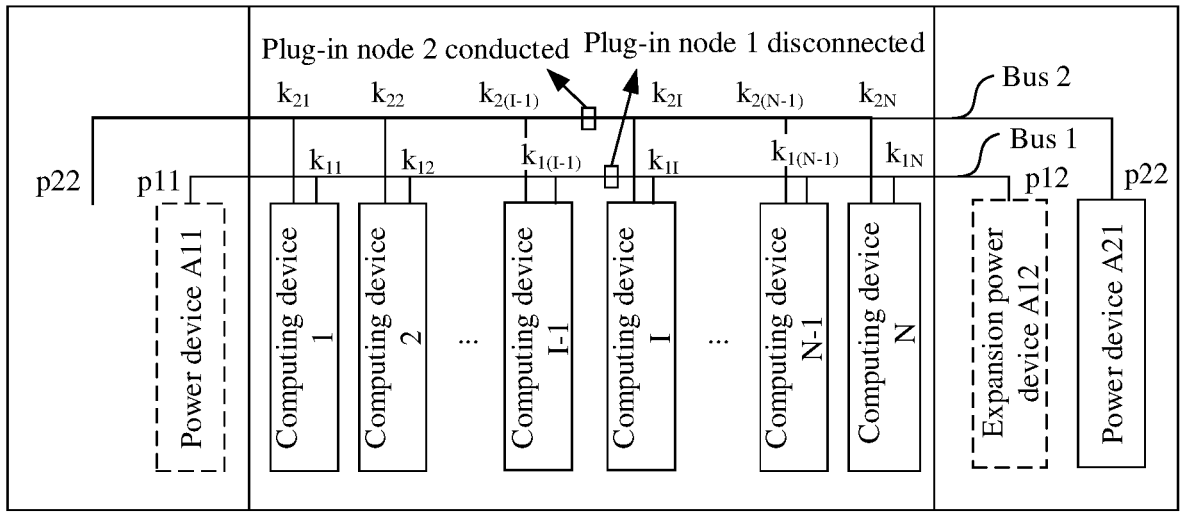
FIG. 5B shows an example of a schematic diagram of a connection state of a data center after being expanded according to Embodiment 2.
Figure 5C:
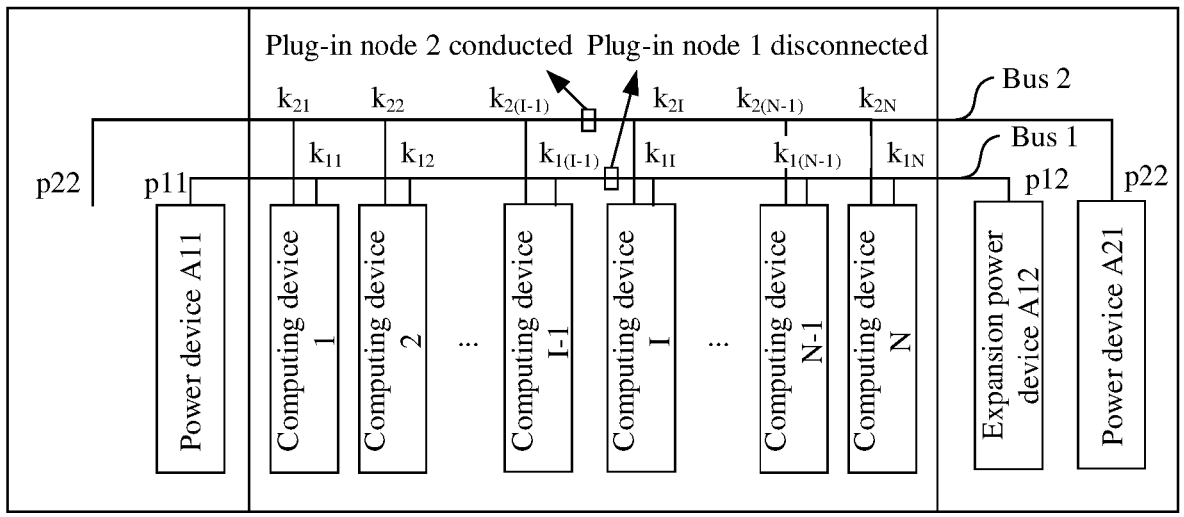
FIG. 5C shows an example of a schematic diagram of a connection state of a data center after being expanded according to Embodiment 2.

Further, during use of the data center, it is determined that the data center needs to be expanded if it is detected that device power of the N computing devices increases because an upgrade operation is performed on the N computing devices, and the electric energy provided by the power device A11 and the power device A21 cannot support the increased device power. Referring to FIG. 5B, during expansion, to ensure electricity safety, the power device A11 may be first brought offline, and the power device A21 supplies power to the computing devices 1 to N in a short time. After the power device A11 is brought offline, the subline 1 and the subline 2 may be disconnected at the plug-in node 1, and then an expansion power device A12 is added to the power module 1, and the electrical connection end $p_{12}$ is connected to the expansion power device A12. In this case, the bus 1 is divided into the subline 1 and the subline 2 by the plug-in node 1. The subline 1 communicates the power device A11 with the computing devices 1 to I−1, and the subline 2 communicates the expansion power device A12 with the computing devices I to N. Referring to FIG. 5C, in this case, the power device A11 and the expansion power device A12 may be brought online. In this way, the power device A11 may supply power to the computing devices 1 to I−1 by using the subline 1, and the expansion power device A12 may supply power to the computing devices I to N by using the subline 2. In addition, the power device A21 may supply power to the computing devices 1 to N respectively by using the subline 3 and the subline 4 that are conducted. Total electric power of the N computing devices is comprehensively provided by the power device A11, the expansion power device A12, and the power device A21.

Figure 5D:
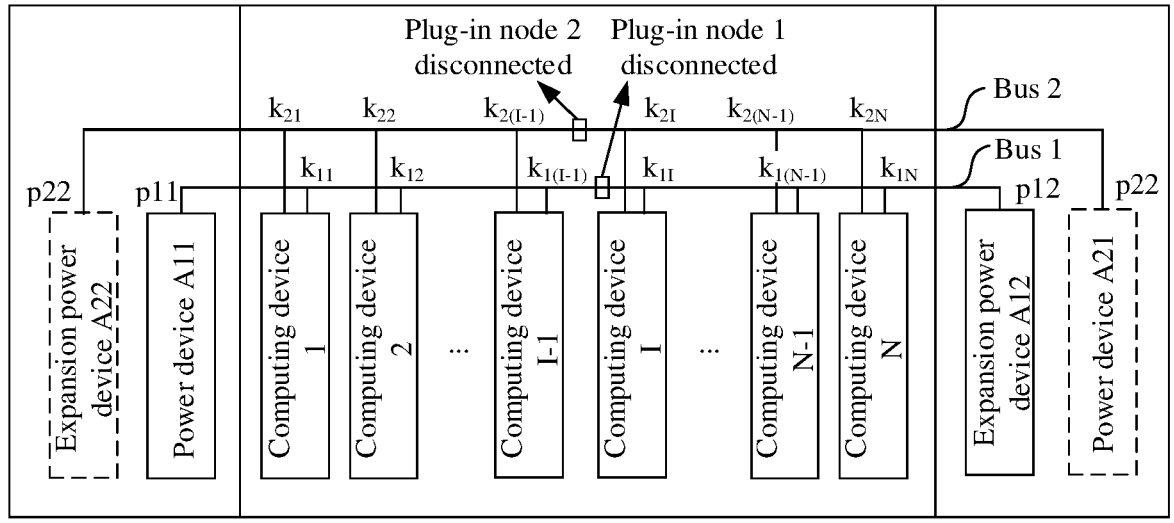
FIG. 5D shows an example of a schematic diagram of a connection state of a data center after being expanded according to Embodiment 2.
Figure 5E:
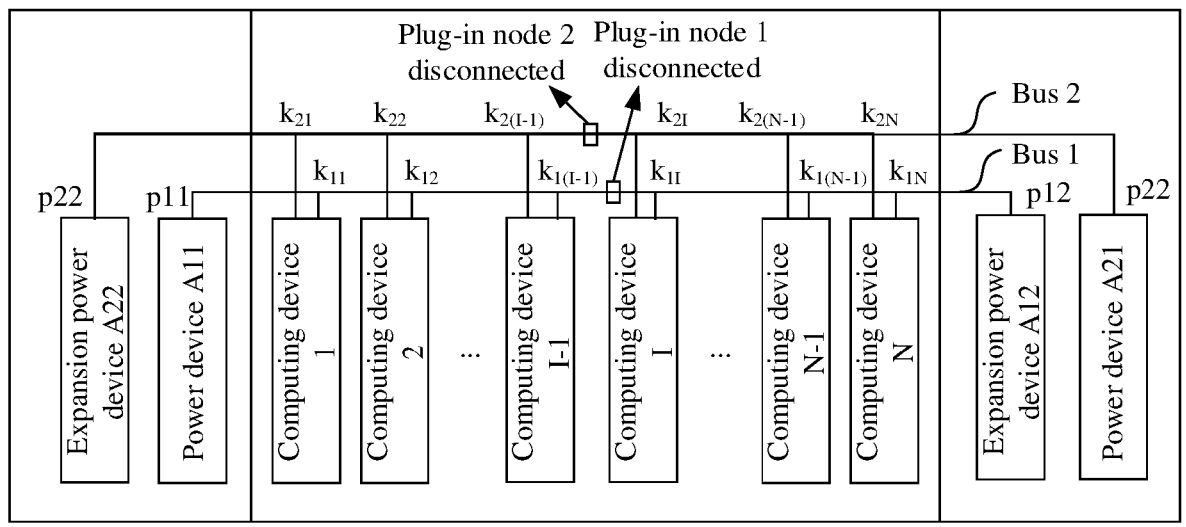
FIG. 5E shows an example of a schematic diagram of a connection state of a data center after being expanded according to Embodiment 2.

Further, if the total electric energy of the power device A11, the expansion power device A12, and the power device A21 still cannot meet requirements for upgrading the N computing devices, secondary expansion needs to be performed on the data center. During the secondary expansion, the power module 1 is saturated (that is, a new expansion power device cannot be placed in space reserved during the initial construction). Therefore, the secondary expansion is performed by using the power module 2 only. Referring to FIG. 5D, to ensure electricity safety of the secondary expansion, the power device A21 may be first brought offline, and the power device A11 and the expansion power device A12 supply power to the computing devices 1 to N in a short time. After the power device A21 is brought offline, the subline 3 and the subline 4 may be disconnected at the plug-in node 2, and then an expansion power device A22 is added to the power module 2, and the electrical connection end $p_{22}$ is connected to the expansion power device A22. In this case, the bus 2 is divided into the subline 3 and the subline 4 by the plug-in node 2. The subline 3 connects the power device A21 and the computing devices I to N, and the subline 4 connects the expansion power device A22 and the computing devices 1 to I−1. Referring to FIG. 5E, in this case, the power device A21 and the expansion power device A22 may be brought online. In this case, the power device A11 supplies power to the computing devices 1 to I−1 by using the subline 1, the expansion power device A12 supplies power to the computing devices 1 to I−1 by using the subline 4, the power device A21 supplies power to the computing devices I to N by using the subline 3, and the power device A12 supplies power to the computing devices I to N by using the subline 2. The total electric power of the N computing devices is comprehensively provided by the power device A11, the expansion power device 12, the power device A21, and the expansion power device A22.

It should be noted that, in FIG. 5B to FIG. 5E, an example in which the power module 1 is expanded first and then the power module 2 is expanded is used for description. In another optional implementation, the power module 2 may be expanded first and then the power module 1 is expanded. In this case, the power device A21 may be brought offline first, and the power device A11 supplies power to the computing devices 1 to N in a short time. Subsequently, the bus 2 is disconnected at the plug-in node 2, and the power device A11 is brought offline after the power device A21 and the expansion power device A22 are brought online. The power device A21 and the expansion power device A22 supply power to the computing devices 1 to N in a short time. Finally, the bus 1 is disconnected at the plug-in node 1, and the power device A11 and the expansion power device A12 are brought online. This implementation is similar to the implementation processes in FIG. 5B to FIG. 5E, except that sequences of using the power modules for expansion are different. Details are not described herein again.

An expansion solution in Embodiment 2 is described below by using a scenario. In this scenario, it is assumed that a value of N is 6, the plug-in node 1 is disposed between an intermediate end $k_{13}$ and an intermediate end $k_{14}$, the plug-in node 2 is disposed between an intermediate end $k_{23}$ and an intermediate end $k_{24}$, and each of the power device A11, the expansion power device A12, the power device A21, and the expansion power device A22 can provide 6 kW of electric power.

In this case, before the data center is expanded, the power device A11 and the power device A21 provide 12 kW of electric power in total for six computing devices. If the six computing devices share the electric power evenly, each computing device can obtain 2 kW of electric power.

After the data center is expanded, if only one-level expansion is performed, the power device A11 provides 6 KW of electric power for computing devices 1 to 3. If the computing devices 1 to 3 share the electric power evenly, each of the computing devices 1 to 3 can obtain 2 kW of electric power, which is the same as that before the expansion. The expansion power device A12 and the power device A21 provide 12 kW of electric power for computing devices 4 to 6. If the computing devices 4 to 6 share the electric power evenly, each of the computing devices 4 to 6 can obtain 4 kW of electric power, and the electric power of the computing devices 4 to 6 is doubled.

If two-level expansion is also performed, the power device A11 and the expansion power device A22 provide 12 kW of electric power for the computing devices 1 to 3, and the expansion power device A12 and the power device A21 provide 12 kW of electric power for the computing devices 4 to 6. If the computing devices 1 to 3 share the electric power evenly, and the computing devices 4 to 6 also share the electric power evenly, each computing device can obtain 4 KW of electric power, and total electric power of the computing devices 1 to 6 is doubled.

It can be understood from the foregoing description that, when the electric power provided by the expansion power device is the same as that provided by the power device, the expansion solution in Embodiment 2 can support expansion of only some of the computing devices whose power is doubled and can also support expansion of all computing devices whose power is doubled.

In addition to the beneficial effects in Embodiment 1, the expansion solution in Embodiment 2 further has the following beneficial effects: On one hand, the expansion solution in Embodiment 2 supports level-by-level expansion according to an upgrade condition of the device power. When an upgrade magnitude of the device power is within an expansion limit of one power module (that is, after an expansion power device is added to one power module, electric energy provided by the power module supports upgraded device power), expansion may be performed on only one power module. When the upgrade magnitude of the device power exceeds the expansion limit of one power module, one-level expansion may be first performed on one power module, and then secondary expansion is performed on the other power module. On the other hand, two power modules are disposed, so that when one of the power modules is expanded, the other power module can still be used to supply power to the N computing devices. In this way, the data center does not need to get offline during the expansion. According to this mode, online upgrade and expansion of the data center can be implemented, thereby helping keep the data center available and improving a service capability of the data center.

Embodiment 1 and Embodiment 2 respectively describe the deployment architecture and the expansion process of the data center by using an example in which one power module is disposed and an example in which two power modules are disposed. It should be understood that, in another embodiment, the data center may alternatively include more than two power modules, for example, three or more power modules. For an initial deployment architecture of each power module, refer to Embodiment 1 or Embodiment 2. During the data center expansion, an expansion power device may be first added to one of the power modules, and a corresponding bus is disconnected by using a corresponding plug-in node. If the expanded data center can meet requirements for upgrading the device power, the expansion may be ended. If the expanded data center still cannot meet the requirements for upgrading the device power, an expansion power device is added to a next power module, until the expanded data center can meet the requirements for upgrading the device power, or position expansion cannot be performed because expansion power devices are added to all the power modules. According to this implementation, pre-disposing three or more power modules during the initial construction can not only achieve the beneficial effects in Embodiment 1 and Embodiment 2, but can also improve an expansion capability of the data center. However, three or more power modules may occupy relatively large space, which causes a decrease in space utilization of the data center, and increases initial construction costs of the data center.

The foregoing embodiment may describe the deployment mode of the computing device and the power device in the data center that are related to expansion. However, in actual deployment, the data center may also include other devices, such as a refrigeration device. The following describes a possible deployment solution of a data center from an overall architecture based on the computing device and the power module in Embodiment 2. In this solution, each type of devices in the data center may be deployed in a corresponding container, and the container and the devices deployed in the container are integrated in a factory in advance. This deployment mode is also referred to as a modular data center (or a container data center). The modular data center requires only 1% of construction costs of a conventional data center and can be migrated directly by moving the container. Therefore, the modular data center has flexible portability and greatly shortens a data center deployment period.

Embodiment 3

Figure 6:
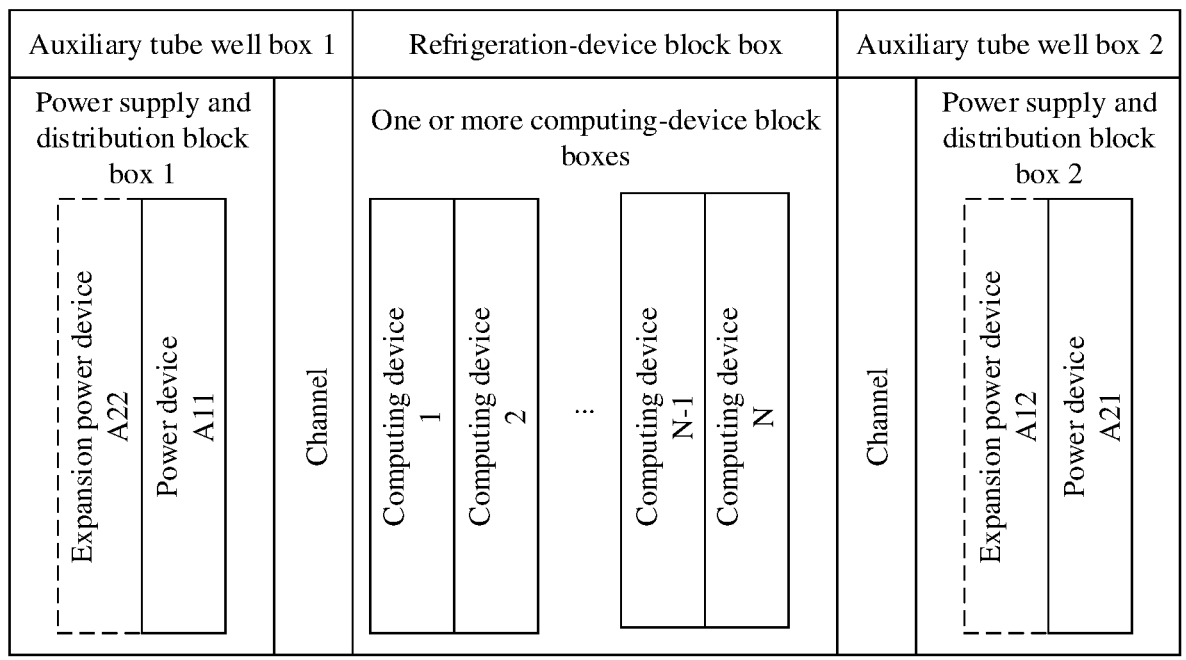
FIG. 6 shows an example of a schematic diagram of an overall architecture of a data center according to Embodiment 3.

FIG. 6 shows an example of a schematic diagram of an overall architecture of a data center according to Embodiment 3. As shown in FIG. 6, in the data center, N computing devices may be deployed in one or more computing-device block boxes. When deployed in one computing-device block box, the N computing devices may be disposed in parallel. When the N computing devices are deployed in a plurality of computing-device block boxes, the computing-device block boxes may be disposed in parallel. Correspondingly, electrical devices may be deployed in one or more power supply and distribution block boxes. For example, an electrical device A11 is deployed in a power supply and distribution block box 1, and an electrical device A21 is deployed in a power supply and distribution block box 2. The computing-device block box and the power supply and distribution block box may be located at a same layer. When only one power device (for example, a power device A11 or a power device A21) is included, a power supply and distribution block box corresponding to the power device may be deployed on one side of the computing-device block box. When two power devices (for example, the power device A11 and the power device A21) are included, power supply and distribution block boxes corresponding to the two power devices may be respectively deployed on two sides of the computing-device block box. It should be understood that, when three or more power devices are included, the three or more power devices may also be correspondingly disposed in two power supply and distribution block boxes shown in FIG. 6. The two power supply and distribution block boxes are respectively deployed on two sides of the computing-device block box.

In a conventional technology, when a plurality of layers are disposed in a data center, a power device may be deployed at a lowest layer, and computing devices are distributed at other layers. Cables are led out from the power device at the lowest layer to the other layers, to supply power to the computing devices. Further, according to this mode, a distance between the power device and the computing device is relatively long, and a cable between the power device and the computing device is also relatively long. A long cable not only increases deployment costs, but also makes troubleshooting inconvenient. However, in this embodiment, when a plurality of layers are disposed in the data center, a power-device block box and the computing-device block box may be deployed at each layer separately, and the computing device in the computing-device block box at each layer can be connected to the power device in the power-device block box disposed at this layer. According to this implementation, a cabling distance between the computing device and the power device is shortened, so that not only deployment costs can be better reduced, but convenience in troubleshooting can also be improved.

It should be noted that "deploying the power device A11 in the power supply and distribution block box 1 and deploying the power device A21 in the power supply and distribution block box 2" is only an optional implementation. In another optional implementation, the power device A11 and the power device A21 may be alternatively deployed in a same power supply and distribution block box. For example, both the power device A11 and the power device A21 are disposed in the power supply and distribution block box 1, or are disposed in the power supply and distribution block box 2. Deploying different power devices in a same power supply and distribution block box or different power supply and distribution block boxes does not affect an operation process during data center expansion. Therefore, details are not described herein.

In an optional implementation, still referring to FIG. 6, in addition to the computing-device block box and the power supply and distribution block box, the data center may further include a refrigeration-device block box and auxiliary tube well boxes, such as an auxiliary tube well box 1 and an auxiliary tube well box 2. The refrigeration-device block box is configured for disposing a refrigeration device therein, and the auxiliary tube well box is configured for disposing an auxiliary tube well therein. The auxiliary tube well box may be disposed on one side of an end wall of the power supply and distribution block box, and communicates with a side surface of the refrigeration-device block box. When the data center includes a plurality of layers, the refrigeration-device block box may also be configured at a same layer as the computing-device block box, and the refrigeration-device block box may be disposed on one side of an end wall of the computing-device block box. In this way, the refrigeration device in the refrigeration-device block box is separated from the computing device at a distance of only one end wall, so that cold air released by a refrigeration block can be directly output to the computing-device block box through a relatively short distance, thereby helping achieve a relatively good cooling effect.

In this embodiment, a cooling function of the refrigeration device may depend on a mechanical systems electrical plumbing (MEP) technology, and a type of the refrigeration device may be set by a person skilled in the art based on experience. For example, the refrigeration device may be a computer room air handler (CRAH) machine, a chiller, an ice machine, or an electroplating refrigerator, which is not limited. Because the CRAH machine has a relatively good cooling effect and relatively low costs, the CRAH machine is used as the refrigeration device in this embodiment.

In an optional implementation, during initial construction of the data center, a quantity of CRAH machines in the refrigeration-device block box may match with requirements on initial device power of the computing device. For example, when the initial device power of the computing device is required to be 6 kW, five CRAH machines or six CRAH machines may be disposed. Further, to enable a cooling function to support expansion synchronously, expansion space for the CRAH machine may also be preset in the refrigeration-device block box. The expansion space is configured to accommodate a new CRAH machine during the expansion. A refrigeration pipe corresponding to the new CRAH machine may also be disposed in advance during the initial construction. The following separately describes two optional deployment modes of the refrigeration-device block box.

Figure 7A:
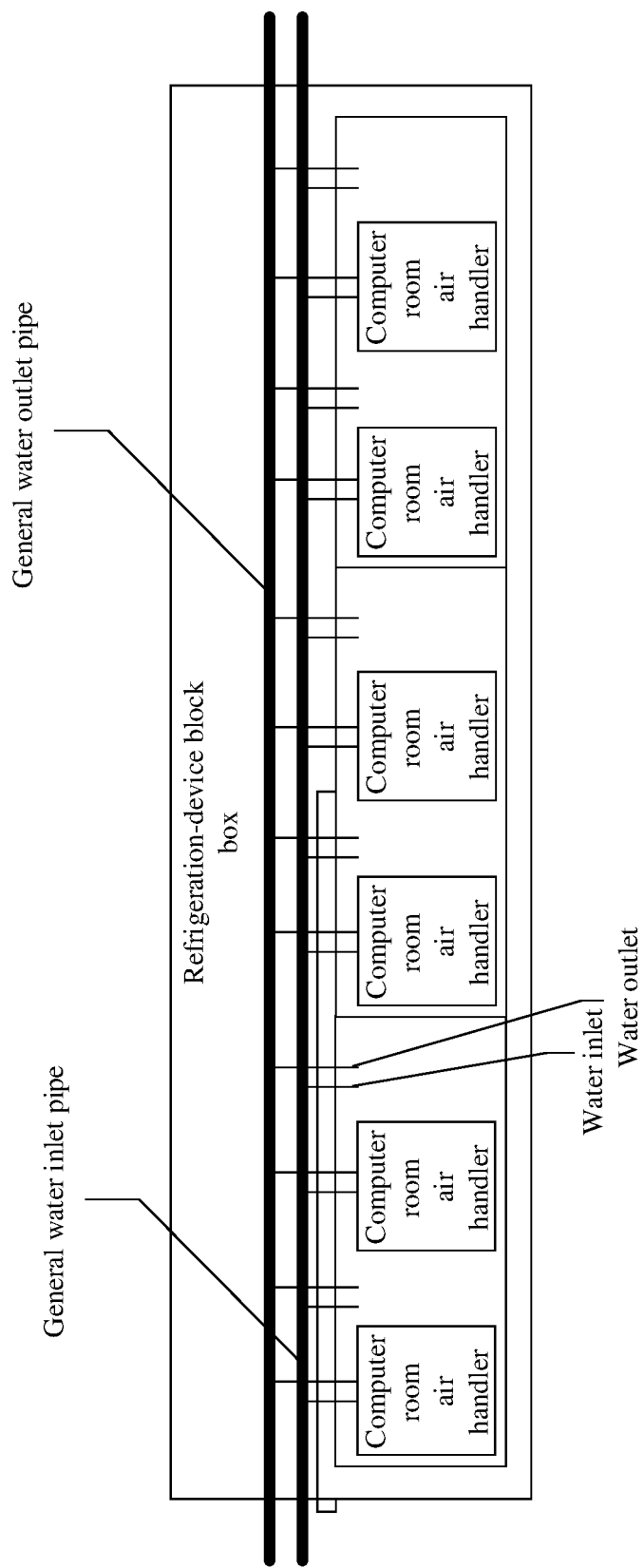
FIG. 7A shows an example of a schematic diagram of a deployment architecture of a refrigeration-device block box during initial construction.
Figure 7B:
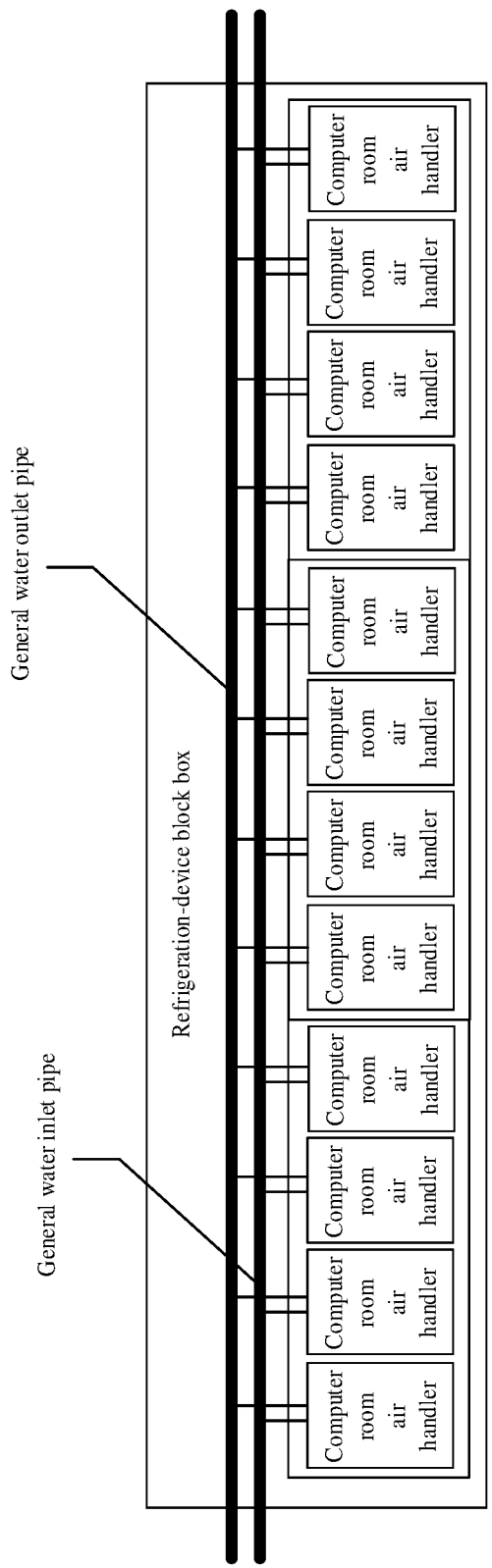
FIG. 7B shows an example of a schematic diagram of a deployment architecture of a refrigeration-device block box during initial construction.

FIG. 7A shows an example of a schematic diagram of a deployment architecture of a refrigeration-device block box during initial construction. As shown in FIG. 7A, during the initial construction, the data center may be provided with a general water inlet pipe, a general water outlet pipe, and three refrigeration-device block boxes. The three refrigeration-device block boxes are combined and communicate with each other through end surfaces. Each refrigeration-device block box may be provided with two CRAH machines, and each CRAH machine in the two CRAH machines includes a water inlet end and a water outlet end. The general water inlet pipe is provided with four water inlets in each refrigeration-device block box. Two of the four water inlets communicate with the water inlet ends of the two CRAH machines through pipes. The general water outlet pipe is provided with four water outlets in each refrigeration-device block box. Two of the four water outlets communicate with the water outlet ends of the two CRAH machines through pipes. In addition, the two water inlets of the general water inlet pipe that are not connected to the CRAH machine may be idle during the initial construction (for example, the two water inlets may be blocked by using corks to avoid water outflow). The two water outlets of the general water outlet pipe that are not connected to the CRAH machine may also be idle during the initial construction (for example, the two water outlets may be blocked by using corks to avoid water outflow). According to the deployment mode shown in FIG. 7A, each refrigeration-device block box can actually accommodate four CRAH machines, while only two CRAH machines are disposed during the initial construction. In this way, during subsequent expansion, if heat dissipation capabilities provided by the two CRAH machines are insufficient to support the device power of the computing device, one new CRAH machine or two new CRAH machines may be added to one or more refrigeration-device block boxes. A water inlet end of the newly added CRAH machine communicates with one idle water inlet, and a water outlet end of the newly added CRAH machine communicates with one idle water outlet. If it is assumed that the device power is increased and four CRAH machines need to be deployed in each refrigeration-device block box, FIG. 7B shows an example of a schematic diagram of a deployment architecture of a refrigeration-device block box after expansion in this case. As shown in FIG. 7B, after the data center is expanded, a quantity of CRAH machines in each refrigeration-device block box is increased to 4. Cooling the computing-device block box by using the four CRAH machines can improve a cooling effect correspondingly when the device power is increased.

Figure 8A:
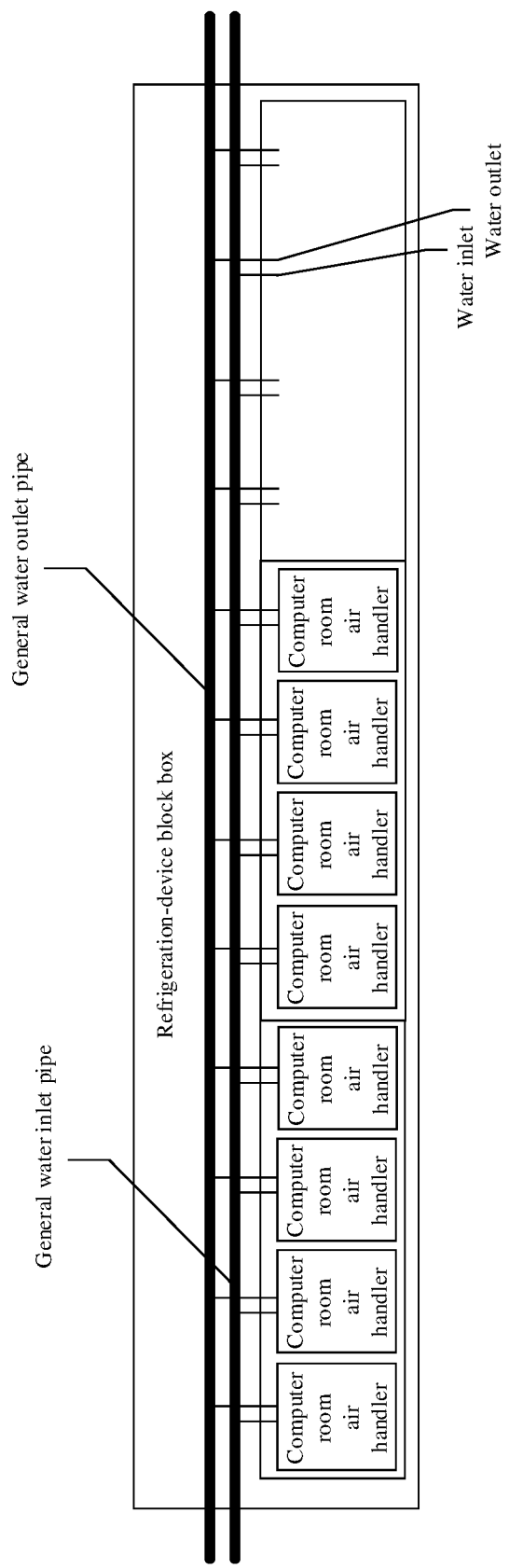
FIG. 8A shows an example of a schematic diagram of another deployment architecture of a refrigeration-device block box during initial construction.
Figure 8B:
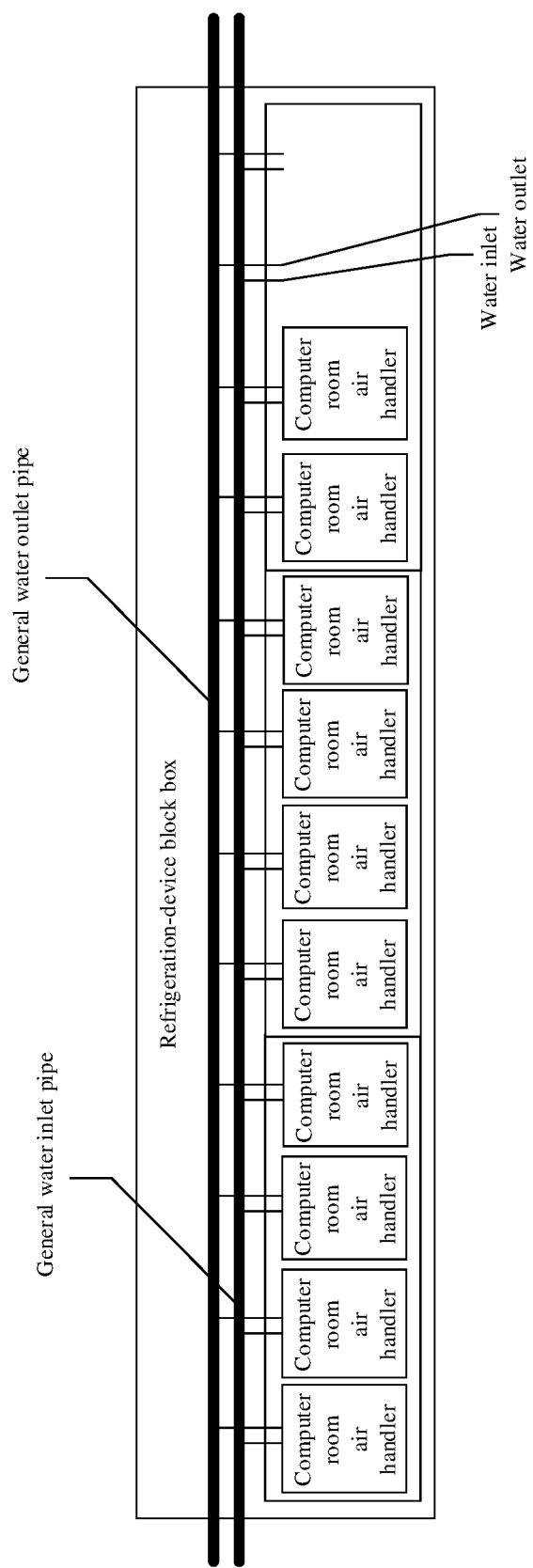
FIG. 8B shows an example of a schematic diagram of another deployment architecture of a refrigeration-device block box during initial construction.

FIG. 8A shows an example of a schematic diagram of another deployment architecture of a refrigeration-device block box during initial construction. As shown in FIG. 8A, during the initial construction, three refrigeration-device block boxes may be disposed in the data center, and the three refrigeration-device block boxes are combined and communicate with each other through end surfaces. One of the three refrigeration-device block boxes is idle. Moreover, each of the other two refrigeration-device block boxes may be provided with four CRAH machines, and a general water inlet pipe is provided with four water inlets in each of the other two refrigeration-device block boxes. The four water inlets communicate with water inlet ends of the four CRAH machines through pipes. A general water outlet pipe is provided with four water outlets in each of the other two refrigeration-device block boxes, and the four water outlets communicate with water outlet ends of the four CRAH machines through pipes. In addition, the general water inlet pipe may further include four water inlets in the idle refrigeration-device block box, and the four water inlets are idle during the initial construction. The general water outlet pipe may further include four water outlets in the idle refrigeration-device block box, and the four water outlets are also idle during the initial construction. In this way, each of the three refrigeration-device block boxes can actually accommodate four CRAH machines, while only two refrigeration-device block boxes are respectively provided with four CRAH machines during the initial construction. In this way, during subsequent data center expansion, if heat dissipation capabilities provided by two refrigeration-device block boxes are insufficient to support the device power of the computing device, any quantity from 1 to 4 of CRAH machines may be further added to the idle refrigeration-device block box. A water inlet end of each newly added CRAH machine communicates with one idle water inlet, and a water outlet end of each newly added CRAH machine communicates with one idle water outlet. If it is assumed that the device power is increased and 10 CRAH machines need to be deployed, FIG. 8B shows an example of a schematic diagram of a deployment architecture of a refrigeration-device block box after expansion in this case. As shown in FIG. 8B, after the data center is expanded, two CRAH machines are added to the idle refrigeration-device block box. Cooling the computing-device block box by using the 10 CRAH machines can improve a corresponding cooling effect when the device power is increased.

In the foregoing two deployment modes of the refrigeration-device block boxes, the data center supports adding of any quantity of CRAH machines during the expansion. In other words, the quantity of the CRAH machines may be increased by using 1 as a minimum unit. According to this mode, the quantity of CRAH machines added each time may match with the device power. This can improve the cooling effect when the device power is increased, without adding too many CRAH machines, thereby helping reduce a capital expenditure of the data center. It should be understood that the foregoing descriptions are only two optional implementations. All solutions in which deployment is performed in a modular manner and a quantity of refrigeration devices is increased during the expansion fall within the scope of the embodiments. This is not limited.

In this embodiment, the power device may be any device or system that outputs electric energy. For example, in one example, the power device may include a transformer entry switch cabinet, a transformer, a low-voltage distribution panel (LVP), an uninterruptible power supply (UPS), and one or more lithium batteries. An input end of the transformer may be connected to a power grid through the transformer entry switch cabinet, and an output end of the transformer may be connected to an input end of the LVP. The input end of the LVP may be connected to an input end of the UPS. A first output end (which may also be used as an input end) of the UPS is connected to the one or more lithium batteries, and a second output end is connected to an electrical connection end. During implementation, when the transformer entry switch cabinet is conducted, the transformer may receive high voltage power input from the power grid through the input end, convert the high voltage power into low voltage power suitable for use, and output the low voltage power to the LVP through the output end. The LVP transfers the low voltage power to the UPS. When power is available at a power-grid end, the UPS not only supplies power to the computing device by using electric energy output from a power-grid side to the LVP, but also charges the lithium battery by using the electric energy. In this way, after a power failure occurs on the power-grid side, the UPS may obtain electric energy input from the lithium battery and supplies power to the computing device by using the electric energy. It can be understood from the foregoing description that in this example, the power device can supply power to the computing device regardless of whether power is available on the power-grid side, so that availability of the data center is relatively high.

Based on the foregoing content, the following describes the data center in this embodiment from an overall architecture.

Figure 9A:
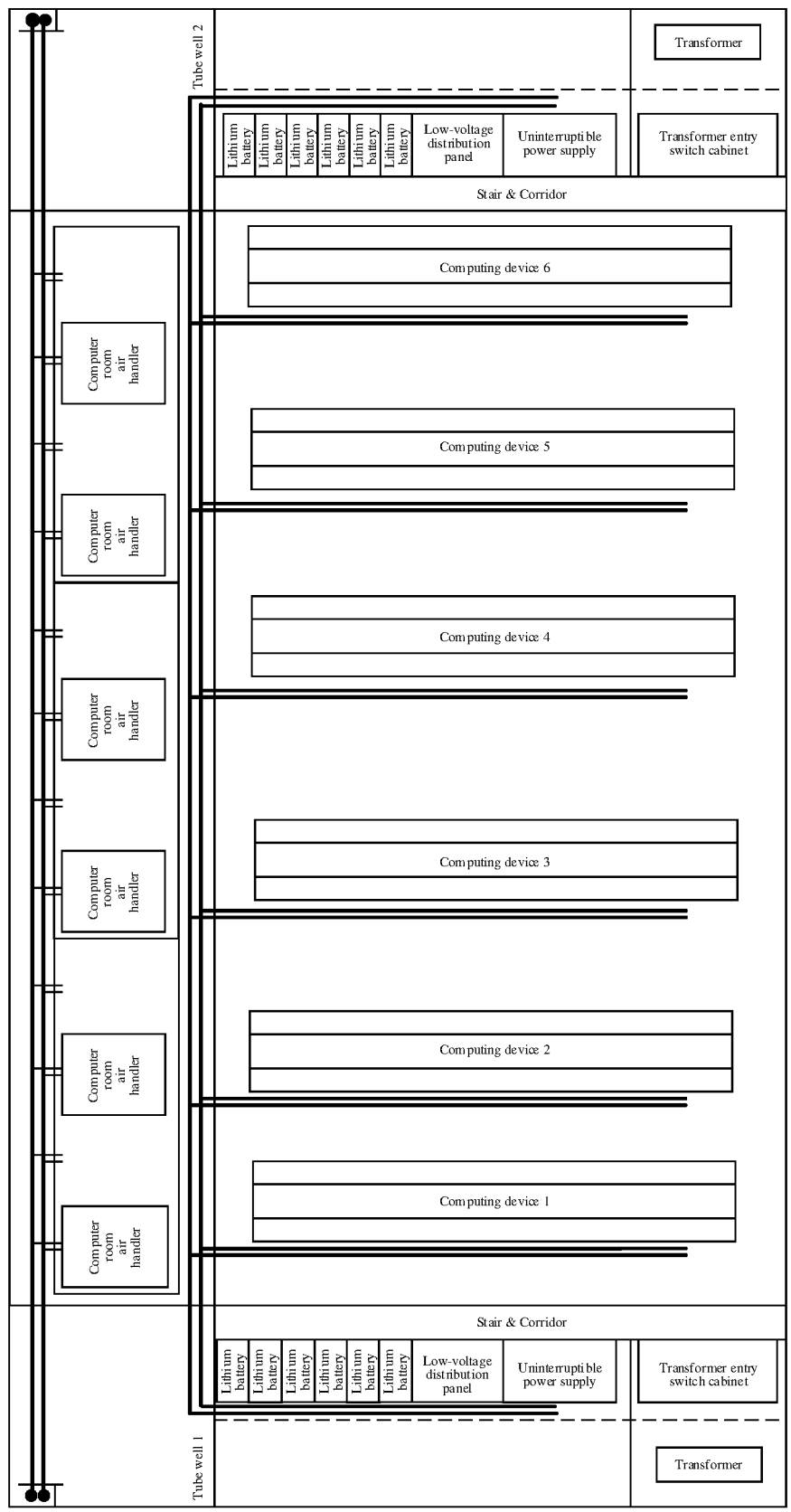
FIG. 9A shows an example of a schematic diagram of an overall architecture of a data center during initial construction according to an embodiment.
Figure 9B:
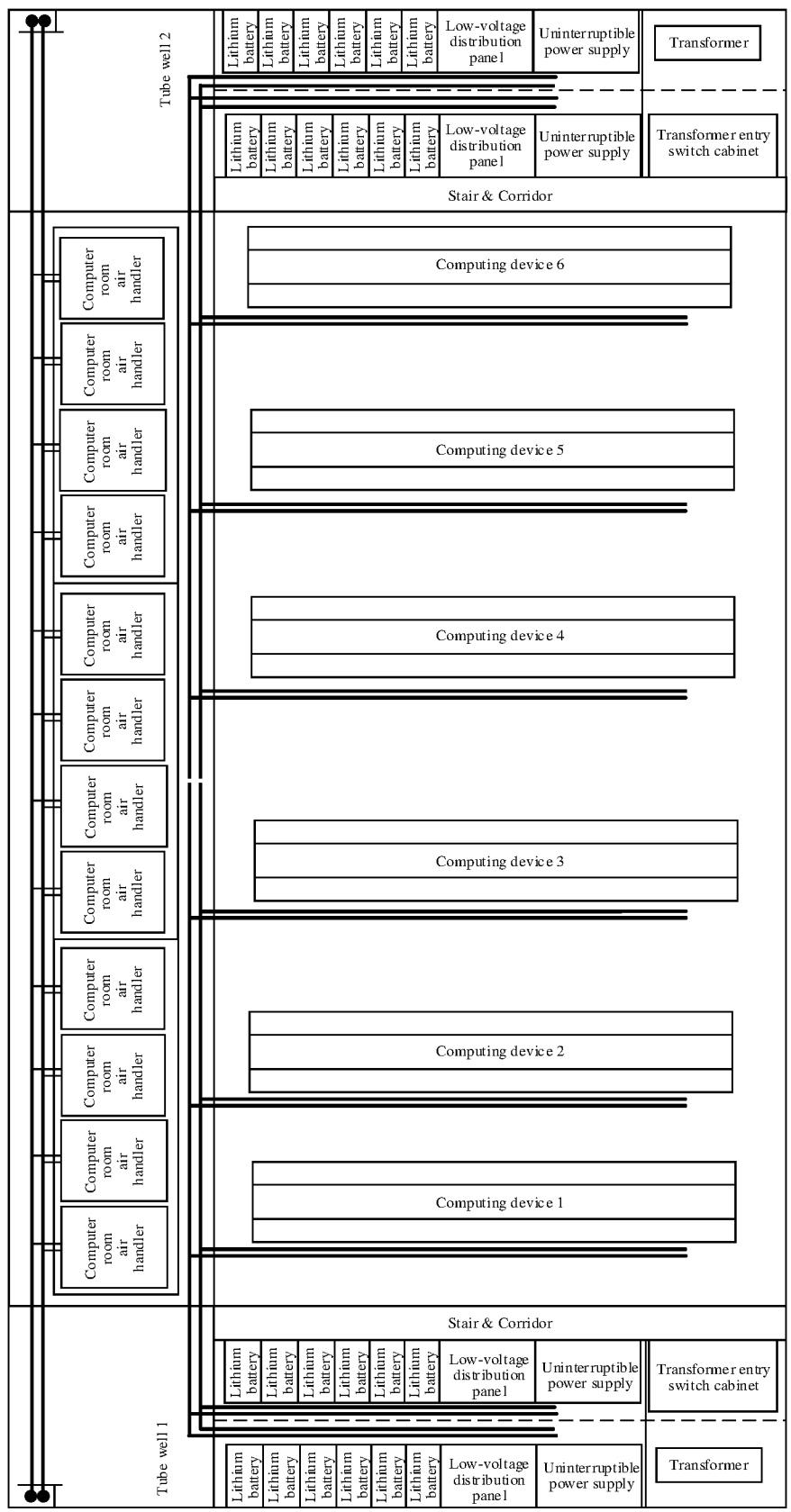
FIG. 9B shows an example of a schematic diagram of an overall architecture of a data center after being expanded according to an embodiment.

FIG. 9A shows an example of a schematic diagram of an overall architecture of a data center during initial construction according to an embodiment. FIG. 9B shows an example of a schematic diagram of an overall architecture of a data center after being expanded according to an embodiment. As shown in FIG. 9A and FIG. 9B, the data center includes six computing devices, two power devices, six refrigeration devices, and two tube wells. These devices are deployed at a same layer. Each of the six computing devices may be disposed in a respective corresponding computing-device block box. In this way, the data center may include six computing-device block boxes, and the computing-device block boxes are disposed in parallel to form a computing-device block box module. The two power devices are distributed in two power supply and distribution block boxes, and each power supply and distribution block box may further include reserved expansion space capable of accommodating one expansion power device. The two power supply and distribution block boxes are respectively disposed on two sides of the computing-device block box module. The six refrigeration devices are distributed in three refrigeration-device block boxes. Each refrigeration-device block box may include two refrigeration devices, and each refrigeration-device block box further includes reserved expansion space capable of accommodating two expansion refrigeration devices and corresponding pipes. The three refrigeration-device block boxes communicate with each other at end surfaces by means that left and right side surfaces shown in the figures are connected, and the three refrigeration-device block boxes may also communicate with an end wall of space in which the computing-device block box is located through lower side surfaces shown in the figures. The three refrigeration-device block boxes that communicate with each other at the end surfaces form one refrigeration-device block box module, and the two tube wells are disposed on two sides of the refrigeration-device block box module.

The following describes the cooling function of the data center. Still referring to FIG. 9A and FIG. 9B, the general water inlet pipe and the general water outlet pipe span the three refrigeration-device block boxes. In addition, in each refrigeration-device block box, four water inlets and four water outlets are respectively led out from the general water inlet pipe and the general water outlet pipe, to implement water circulation of two refrigeration devices and two reserved expansion refrigeration devices. Each refrigeration-device block box is provided with an air supply channel and an air return channel on a lower side surface shown in the figures (this is not illustrated in FIG. 9A and FIG. 9B). During cooling, each refrigeration-device block box feeds, by using the air supply channel, cold air into space in which the computing-device block box is located for cooling processing, and then recycles, by using the air return channel, hot air in the space in which the computing-device block box is located to the refrigeration-device block box, to generate cold air circularly. To ensure the cooling effect, a sealing channel assembly further needs to be used to block other gaps except the air supply channel and the air return channel in the space in which the computing-device block box is located. For example, gaps except a subline on a path from an intermediate end that is corresponding to a bus and that is on the end wall to a computing device are sealed. In this way, the space in which the computing-device block box is located and the refrigeration-device block box form an enclosed area, thereby facilitating the cooling effect and cooling utilization. In addition, the pipes in the refrigeration-device block box may be interconnected in a flexible connection manner, so that the pipes can not only achieve sealing at a connection position through expansion, but also have excellent impermeability performance.

An expansion function of the data center is further described below. Continuing to refer to FIG. 9A and FIG. 9B, each of the two power supply and distribution block boxes has a corresponding bus. The bus spans the power supply and distribution block box 1, a tube well 1, the refrigeration-device block box module, a tube well 2, and the power supply and distribution block box 2. Sublines are led out from the three refrigeration-device block boxes to supply power to the computing device. For example, a power device on a left side shown in FIG. 9A is used as an example. An output end of the power supply and distribution block box 1 in which the power device is located is interconnected with an input end of a bus segment in the tube well 1. An output end of the bus segment in the tube well 1 is interconnected with an input end of a bus segment in the refrigeration-device block box module. At the intermediate end, six sublines are led out from the bus segment in the refrigeration-device block box module to communicate with small buses of the six computing devices, to supply power to the six computing devices. Moreover, there are one or more plug-in nodes on the bus segment in the refrigeration-device block box module. An output end of the bus segment in the refrigeration-device block box module is interconnected with an input end of a bus segment in the tube well 2. An output end of the bus segment in the tube well 2 is led out to the power supply and distribution block box 2. As shown in FIG. 9A, before the data center is expanded, there is one power device in the power supply and distribution block box 1 on the left side shown in FIG. 9A, and there is also one power device in the power supply and distribution block box 2 on the right side shown in FIG. 9A. The two power devices respectively supply power to the six computing devices by using two buses. As shown in FIG. 9B, after the data center is expanded, one expansion power device is added to the power supply and distribution block box 1 on the left side shown in FIG. 9B, and one expansion power device is also added to the power supply and distribution block box 2 on the right side shown in FIG. 9B. Both buses are disconnected at middle positions. In this way, the two power devices in the power supply and distribution block box 1 on the left side shown in FIG. 9B supply power to computing devices 1 to 3, and the two power devices in the power supply and distribution block box 2 on the right side shown in FIG. 9B supply power to computing devices 4 to 6. After the data center is expanded, the cooling effect of the original six refrigeration devices in the refrigeration-device block box may be insufficient because the device power of the computing device is increased. In this case, a new expansion refrigeration device may be further disposed in the expansion space reserved in the refrigeration-device block box. For example, as shown in FIG. 9B, six expansion refrigeration devices are added, and a water outlet end and a water inlet end of the new expansion refrigeration device respectively communicate with a water outlet and a water inlet that are restricted.

It may be understood that, the example in FIG. 9B is that expansion is implemented by adding an entire system including the LVP, the UPS, and a lithium battery cabinet to the power supply and distribution block box. In another optional implementation, only the LVP, the UPS, and the lithium battery cabinet may be added, and other accessories may directly be accessories of the original power device. This is not limited.

It may be understood that the quantity of the computing devices, the quantity of the refrigeration devices, the quantity of the power devices, the quantity of the tube wells, the quantity of the computing-device block boxes, the quantity of the refrigeration-device block boxes, the quantity of the power supply and distribution block boxes, and the quantity of the auxiliary tube well boxes that are illustrated in the foregoing embodiments are set for ease of understanding the solution. These quantities are not limited.

According to the implementations shown in FIG. 9A and FIG. 9B, when the data center needs to be expanded, only the expansion power device may be added, and the original cables may be directly used without disposing new cables, thereby avoiding a phenomenon of dense cables in the data center. In addition, according to the foregoing modes, cooling expansion can be further performed when power device expansion is performed. Moreover, during the cooling expansion, only the expansion refrigeration device may be added, and the reserved water inlets and water outlets may be directly used without re-disposing water inlet pipes and water outlet pipes. It can be understood from the foregoing description that in this implementation, during the initial construction of the data center, cables and pipes are deployed according to a final specification, so that the original cables and pipes can be directly used during the subsequent expansion without disposing new cables and pipes, thereby reducing expansion costs of the data center.

The foregoing descriptions are merely implementations, but are not intended to limit the scope of the embodiments. Any variation or replacement readily figured out by a person skilled in the art shall fall within the scope of the embodiments.

What is claimed is:

1. A data center comprising:
    N computing devices; and
    T power modules, wherein each power module in the T power modules comprises a first power device and a bus; the bus comprises a first electrical connection end, N intermediate ends, and a second electrical connection end; the first electrical connection end is connected to the first power device; the N intermediate ends are respectively connected to the N computing devices; a plug-in node is disposed between an $(I-1)^{th}$ intermediate end and an $I^{th}$ intermediate end of the N intermediate ends; and the plug-in node divides the bus into a first subline and a second subline, wherein T is a positive integer, N and I are positive integers greater than or equal to 2, and it is satisfied that I<N; and
    for at least one power module in the T power modules:

before the data center is expanded, the plug-in node of the at least one power module communicates the first subline with the second subline, and the second electrical connection end of the at least one power module is idle; and after the data center is expanded, the plug-in node of the at least one power module disconnects the first subline and the second subline, and the second electrical connection end of the at least one power module is connected to a second power device for expansion.

2. The data center according to claim 1, wherein the N computing devices are placed in one or more computing-device block boxes, first power devices in the T power modules are placed in one or more power-device block boxes, and the one or more computing-device block boxes and the one or more power-device block boxes are disposed at a same layer in the data center.

3. The data center according to claim 2, wherein when a quantity of the one or more computing-device block boxes is greater than or equal to 2, the one or more computing-device block boxes are disposed in parallel to form a computing-device block box module; and the one or more power-device block boxes are placed on one side or both sides of the computing-device block box module.

4. The data center according to claim 3, further comprising:
a general water inlet pipe;
a general water outlet pipe; and
L refrigeration devices, wherein the L refrigeration devices are configured to cool the N computing devices, P water inlets are disposed on the general water inlet pipe, P water outlets are disposed on the general water outlet pipe, L water inlets in the P water inlets are respectively connected to water inlet ends of the L refrigeration devices, L water outlets in the P water outlets are respectively connected to water outlet ends of the L refrigeration devices, P and L are positive in integers, and it is satisfied that P>L;
before the data center is expanded, P-L water inlets except the L water inlets in the P water inlets are idle, and P-L water outlets except the L water outlets in the P water outlets are idle; and
after the data center is expanded, one or more water inlets in the idle P-L water inlets are respectively connected to water inlet ends of one or more refrigeration devices for expansion, and one or more water outlets in the idle P-L water outlets are respectively connected to water outlet ends of the one or more refrigeration devices for expansion.

5. The data center according to claim 2, further comprising:
a general water inlet pipe;
a general water outlet pipe; and
L refrigeration devices, wherein the L refrigeration devices are configured to cool the N computing devices, P water inlets are disposed on the general water inlet pipe, P water outlets are disposed on the general water outlet pipe, L water inlets in the P water inlets are respectively connected to water inlet ends of the L refrigeration devices, L water outlets in the P water outlets are respectively connected to water outlet ends of the L refrigeration devices, P and L are positive integers, and it is satisfied that P>L;
before the data center is expanded, P-L water inlets except the L water inlets in the P water inlets are idle, and P-L water outlets except the L water outlets in the P water outlets are idle; and
after the data center is expanded, one or more water inlets in the idle P-L water inlets are respectively connected to water inlet ends of one or more refrigeration devices for expansion, and one or more water outlets in the idle P-L water outlets are respectively connected to water outlet ends of the one or more refrigeration devices for expansion.

6. The data center according to claim 1, further comprising:
a general water inlet pipe;
a general water outlet pipe; and
L refrigeration devices, wherein the L refrigeration devices are configured to cool the N computing devices, P water inlets are disposed on the general water inlet pipe, P water outlets are disposed on the general water outlet pipe, L water inlets in the P water inlets are respectively connected to water inlet ends of the L refrigeration devices, L water outlets in the P water outlets are respectively connected to water outlet ends of the L refrigeration devices, P and L are positive integers, and it is satisfied that P>L;
before the data center is expanded, P-L water inlets except the L water inlets in the P water inlets are idle, and P-L water outlets except the L water outlets in the P water outlets are idle; and
after the data center is expanded, one or more water inlets in the idle P-L water inlets are respectively connected to water inlet ends of one or more refrigeration devices for expansion, and one or more water outlets in the idle P-L water outlets are respectively connected to water outlet ends of the one or more refrigeration devices for expansion.

7. The data center according to claim 6, wherein the L refrigeration devices are placed in one or more refrigeration-device block boxes; and
when a quantity of the one or more refrigeration-device block boxes is greater than or equal to 2, the one or more refrigeration-device block boxes are placed in parallel, and side surfaces of any two adjacent refrigeration-device block boxes communicate with each other.

8. The data center according to claim 7, wherein the one or more refrigeration-device block boxes and the one or more computing-device block boxes are disposed at a same layer in the data center, and the one or more refrigeration-device block boxes are placed on one side of an end wall of the one or more computing-device block boxes, wherein the end wall is disposed on a side surface perpendicular to a side surface that is disposed in parallel with the one or more computing-device block boxes; and
an air supply channel and an air return channel are disposed on the end wall, and the L refrigeration devices in the one or more refrigeration-device block boxes cool the N computing devices by using the air supply channel and the air return channel.

9. The data center according to claim 8, wherein, when T is a positive integer greater than or equal to 2, for each power module in the T power modules:
the bus of the power module is led out from the power-device block box in which the first power device of the power module is located, traverses the one or more refrigeration-device block boxes, leads out N sublines from the end wall to respectively connect the N computing devices, and terminates in the power-device block box in which the first power device of another power module is located, wherein the first electrical connection end of the power module is located in the power-device block box in which the first power device of the power module is located, and the idle second electrical connection end of the power module is located in the power-device block box in which the first power device of the another power module is located.

10. The data center according to claim 9, wherein the one or more refrigeration-device block boxes are placed in parallel to form a refrigeration-device block box module; and the data center further comprises one or more tube wells, and the one or more tube wells are disposed on one side or both sides of the refrigeration-device block box module.

11. The data center according to claim 8, wherein the one or more refrigeration-device block boxes are placed in parallel to form a refrigeration-device block box module; and the data center further comprises one or more tube wells, and the one or more tube wells are disposed on one side or both sides of the refrigeration-device block box module.

12. The data center according to claim 7, wherein the one or more refrigeration-device block boxes are placed in parallel to form a refrigeration-device block box module; and the data center further comprises one or more tube wells, and the one or more tube wells are disposed on one side or both sides of the refrigeration-device block box module.

13. A data center expansion method applied to the data center according to claim 1, the method comprising:

detecting device power of N computing devices in the data center; and when the device power is greater than a preset expansion device power threshold, determining at least one power module from T power modules, and performing the following steps for each power module in the at least one power module:

controlling a first power device in the power module to be in a power-off state, and disconnecting a plug-in node of the power module; and after it is detected that a second power device for expansion is connected to an idle second electrical connection end of the power module, controlling the first power device and the second power device for expansion to be in a power supply state.

14. The data center expansion method according to claim 13, wherein when the data center further comprises a general water inlet pipe, a general water outlet pipe, and L refrigeration devices, after the controlling the first power device and the second power device for expansion to be in a power supply state, the method further comprises:

detecting temperatures of the N computing devices;

when the temperature is greater than a preset temperature threshold, suspending a water inlet operation of the general water inlet pipe and a water outlet operation of the general water outlet pipe; and after it is detected that a refrigeration device for expansion is connected to the general water inlet pipe and the general water outlet pipe, restoring the water inlet operation of the general water inlet pipe and the water outlet operation of the general water outlet pipe.

* * * * *